United States Patent
Diegmann

(10) Patent No.: US 11,249,115 B2
(45) Date of Patent: Feb. 15, 2022

(54) ELECTRICAL TEST AND MEASUREMENT DEVICE, MEASUREMENT EXTENSION DEVICE AS WELL AS TEST AND MEASUREMENT SYSTEM

(71) Applicant: Rohde & Schwarz GmbH & Co. KG, Munich (DE)

(72) Inventor: Philip Diegmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 602 days.

(21) Appl. No.: 15/981,531

(22) Filed: May 16, 2018

(65) Prior Publication Data
US 2018/0335453 A1    Nov. 22, 2018

(30) Foreign Application Priority Data
May 18, 2017   (EP) .................................... 17171742

(51) Int. Cl.
*G01R 13/28*  (2006.01)
*G01R 19/25*  (2006.01)
*G01R 13/00*  (2006.01)

(52) U.S. Cl.
CPC .............. *G01R 13/28* (2013.01); *G01R 13/00* (2013.01); *G01R 19/2509* (2013.01)

(58) Field of Classification Search
CPC ..... G01R 13/28; G01R 13/00; G01R 19/2509
USPC ........................................................ 702/67
See application file for complete search history.

(56) References Cited

U.S. PATENT DOCUMENTS

| | | | |
|---|---|---|---|
| 4,317,199 A * | 2/1982 | Winslow | G06F 11/221 714/30 |
| 4,743,844 A | 5/1988 | Odenheimer et al. | |
| 4,758,963 A | 7/1988 | Gordon et al. | |
| 6,320,577 B1 * | 11/2001 | Alexander | G01R 13/02 345/440 |
| 7,957,938 B2 * | 6/2011 | LaMarche | G01R 23/16 702/189 |
| 8,324,885 B2 * | 12/2012 | Dobyns | G01R 31/3167 324/121 R |
| 2008/0036726 A1 | 2/2008 | Kuhwald et al. | |
| 2013/0207641 A1 | 8/2013 | Timm et al. | |
| 2015/0054492 A1 | 2/2015 | Mende et al. | |
| 2016/0139178 A1 | 5/2016 | Johnson et al. | |
| 2017/0067940 A1 | 3/2017 | Chen et al. | |

FOREIGN PATENT DOCUMENTS

EP    2302400 A1    3/2011

OTHER PUBLICATIONS

Tektronix, Dual Scope Synchronization, pp. 1-10 (Year: 2012).*
Lecroy Corporation, Wavemaster and Wavepro: Synchronizing Multiple Oscilloscopes Va the External Reference Input, pp. 1-2 (Year: 2009).*

* cited by examiner

*Primary Examiner* — Aditya S Bhat
(74) *Attorney, Agent, or Firm* — Christensen O'Connor Johnson Kindness PLLC

(57) ABSTRACT

An electrical test and measurement device is described that has at least one analog channel comprising an analog input, an attenuator circuit, an amplifier unit, and a digitizer. The electrical test and measurement device comprises another digitizer allocated to a digitizer input of the electrical test and measurement device. The digitizer input is configured to be connected to a measurement extension device. Further, a measurement extension device and a test and measurement system are described.

20 Claims, 4 Drawing Sheets

ELECTRICAL TEST AND MEASUREMENT DEVICE, MEASUREMENT EXTENSION DEVICE AS WELL AS TEST AND MEASUREMENT SYSTEM

CROSS-REFERENCE TO RELATED APPLICATION

This application claims priority to European Application No. 17171742.4, filed May 18, 2017, the disclosure of which is incorporated herein by reference in its entirety.

FIELD OF THE DISCLOSURE

Embodiments of the present disclosure relate generally to an electrical test and measurement device, a measurement extension device as well as a test and measurement system.

BACKGROUND

In the prior art, test and measurement devices such as oscilloscopes are known that comprise several analog input channels which are also called measurement channels. Typically, oscilloscopes have four analog input channels that can be used to perform measurements on a single device under test or several devices under test, for example simultaneously.

However, certain test scenarios require more than four analog input channels in order to measure the desired characteristics and properties of a certain device under test. For instance, the switch-on behavior of a device under test, for example the power sequencing, of several voltages on a certain device under test may be verified simultaneously. For those measurements, the user has to use oscilloscopes that have more than four analog input channels. However, these oscilloscopes are expensive and the high number of analog input channels is used rarely.

Accordingly, there is a need for a cost-efficient possibility to perform measurements that require several analog input channels.

SUMMARY

Embodiments of the present disclosure provide an electrical test and measurement device with at least one analog channel that comprises an analog input, an attenuator circuit, an amplifier unit, and a digitizer, wherein the electrical test and measurement device comprises another digitizer allocated to a digitizer input of the electrical test and measurement device, wherein the digitizer input is configured to be connected to a measurement extension device.

Embodiments of the present disclosure further provide a measurement extension device for being connected to an electrical test and measurement device, wherein the measurement extension device has at least one analog channel comprising an analog input, an attenuator circuit, and an amplifier unit, wherein the measurement extension device has an analog output interface.

Furthermore, embodiments of the present disclosure also provide a test and measurement system comprising a test and measurement device as described above and a measurement extension device as described above.

Accordingly, the electrical test and measurement device can be extended by using a separately formed measurement extension device that is connected to the digitizer input. The digitizer input is configured to process signals each having several analog signals inputted to the separately formed measurement extension device. Thus, the number of analog channels can be increased by using the separately formed measurement extension device that is connected to the electrical test and measurement device. The measurement extension device is connected to the electrical test and measurement device, for example its digitizer input, via the analog output interface. Thus, the analog output interface is configured to forward signals that each has several analog signals being inputted to the measurement extension device previously. In general, the analog output interface ensures transmission of high bandwidth signals in a cost-efficient manner compared to a digitized signal. The analog signals forwarded to the test and measurement device are digitized internally.

The analog channels provided at the test and measurement device may be labeled as internal analog channels whereas the analog channels provided due to the connection to the measurement extension device may be labeled as external analog channels.

In general, the number of analog channels of the electrical test and measurement device is increased by the measurement extension device to be connected to the electrical test and measurement device. Hence, the digitizer input is configured to process signals each having several analog signals inputted to the separately formed measurement extension device.

The analog output interface may be a common analog output interface with which the analog channels are each connected so that the measurement extension device is configured to increase the number of analog channels of the electrical test and measurement device.

Generally, the measurement extension device is configured to extend the connectivity functionality by providing additional analog channels and/or analog inputs.

According to an aspect, at least two analog channels are provided, for example four analog channels. Thus, the electrical test and measurement device already provides the possibility to perform measurements while using integrated analog channels that are also called internal analog channels. Thus, the measurement extension device to be connected to the electrical test and measurement device is used to increase the number of analog channels appropriately for certain measurement requiring more analog channels than provided by the test and measurement device itself.

According to another aspect, a signal processing unit is provided. The signal processing unit of the electrical test and measurement device is used to process the signals received via the analog channels as well as the digitizer input. Accordingly, the processing unit of the electrical test and measurement device is configured to process the signals forwarded via the digitizer input wherein these signals may comprise different analog signals being inputted to the measurement extension device.

In some embodiments, the signal processing unit has a predetermined maximum sample rate processing power. The sample rate may be 20 Giga Samples/second (GS/s).

Further, the signal processing unit may comprise at least one decimator configured to decimate the sample rate. Thus, it is ensured that the maximum sample rate processing power is split appropriately such that the several signals forwarded via the internal analog channels and the external analog channels relating to the digitizer input are processed in a homogeneous manner. Accordingly, the decimator distributes the maximum sample rate processing power homogeneously. For instance, the maximum sample rate processing power of 20 GS/s are divided into 8×2.5 GS/s for four internal analog channels and four external analog channels established by the external measurement extension device connected to the electrical test and measurement device.

According to a certain embodiment, the electrical test and measurement device is an oscilloscope. Typically, an oscilloscope is used to process analog signals.

According to an aspect with regard to the measurement extension device, the analog channel further comprises an isolating unit configured to isolate the analog output interface from at least one of the attenuator circuit and the amplifier unit. This isolating unit may provide a galvanic isolation such that offset voltages can be lowered that occur due to the connection of the separately formed measurement extension device. The isolating unit may comprise at least one of an isolating transformer, an optical element, and a capacitive isolator.

In some embodiments, the isolating unit comprises a power supply interface. Thus, the measurement extension device, for example its amplifier unit, is powered by the electrical test and measurement device when the measurement extension device is connected to the electrical test and measurement device.

Further, the isolating unit may comprise an isolated control signal interface configured to control the amplifier unit. Thus, the amplifying is also controlled by the electrical test and measurement device.

Generally, the isolation unit ensures that the different signals do not interfere with each other.

According to a certain embodiment, a time delay compensation unit is provided that is configured to compensate time delays introduced by the analog channel, for example wherein the time delay compensation unit comprises a switch unit allocated to the analog input wherein the switch unit is configured to switch between a calibration signal interface and an input channel allocated to the analog input. This ensures that the occurrence of time delays can be compensated appropriately wherein the time delay occurring is previously determined by comparing a calibration signal sent to the amplifier unit via the calibration signal interface and the calibration signal received by the amplifier unit. This time delay can be calculated and compensated afterwards.

The analog output interface may be configured to be connected with a test and measurement device. The measurement extension device is connected via its analog output interface to the digitizer input of the electrical test and measurement device such that the digitizer input of the electrical test and measurement device corresponds to the number of analog inputs of the measurement extension device.

Moreover, the amplifier unit may comprise a variable gain amplifier. The variable gain amplifier is used for high dynamic input and high input bandwidth. Accordingly, the measurement extension device can be used for signals being dynamic and broadband.

The measurement extension device has at least two analog channels, for example four analog channels. Thus, several analog channels are provided additionally when the measurement extension device is connected to the test and measurement device. The several analog channels are combined within the measurement extension device and afterwards outputted via a single line that is provided between the analog output interface of the measurement extension device and the digitizer input of the electrical test and measurement device. Accordingly, complex measurements or measurements on complex devices under test can be performed such as measuring power rail sequencing devices that require more than four channels simultaneously.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
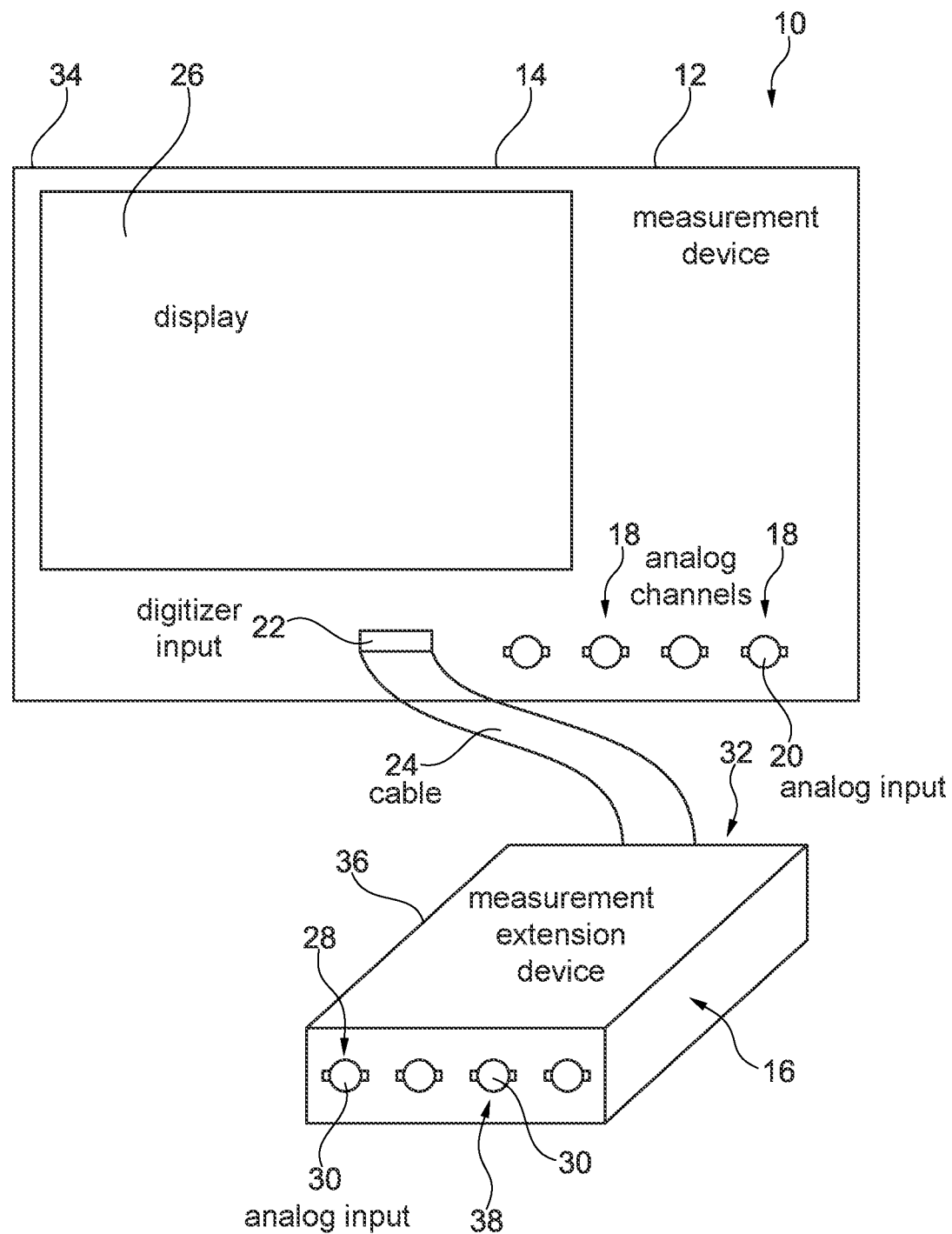
FIG. 1 schematically shows a test and measurement system according to an embodiment of the present disclosure.

In FIG. 1, a test and measurement system 10 is shown that comprises an electrical test and measurement device 12 that is established by an oscilloscope 14 as well as a measurement extension device 16 that is connected to the test and measurement device 12. In the shown embodiment, the test and measurement device 12 has four analog channels 18 that each comprises an analog input 20, for instance a BNC input. The analog inputs 20 are positioned such that they can be connected easily, for instance at an outer surface of the test and measurement device 12.

Further, the test and measurement device 12 comprises a digitizer input 22 that is connected to the separately formed measurement extension device 16. The connection is established by a cable 24, for instance a flat conductor. In general, the cable 24 used ensures transmission of high bandwidth signals. Moreover, the test and measurement device 12 has a display 26 that is configured to illustrate signals received via the analog channels 18. Further, the display 26 is configured to display signals received via the digitizer input 22.

As shown in FIG. 1, the measurement extension device 16 has four analog channels 28 that each comprises an analog input 30. Further, the measurement extension device 16 has an analog output interface 32 that is connected to the cable 24 such that the connection between the test and measurement device 12 and the measurement extension device 16 is established via the cable 24 that connects the digitizer input 22 and the analog output interface 32. Due to the analog output interface 32, analog signals are transmitted via the cable 24 towards the test and measurement device 12.

As shown in FIG. 1, the test and measurement device 12 may comprise a housing 34 wherein the measurement extension device 16 comprises an outer box 36 for encompassing the internal components shown in FIG. 3 as will be described later.

Figure 2:
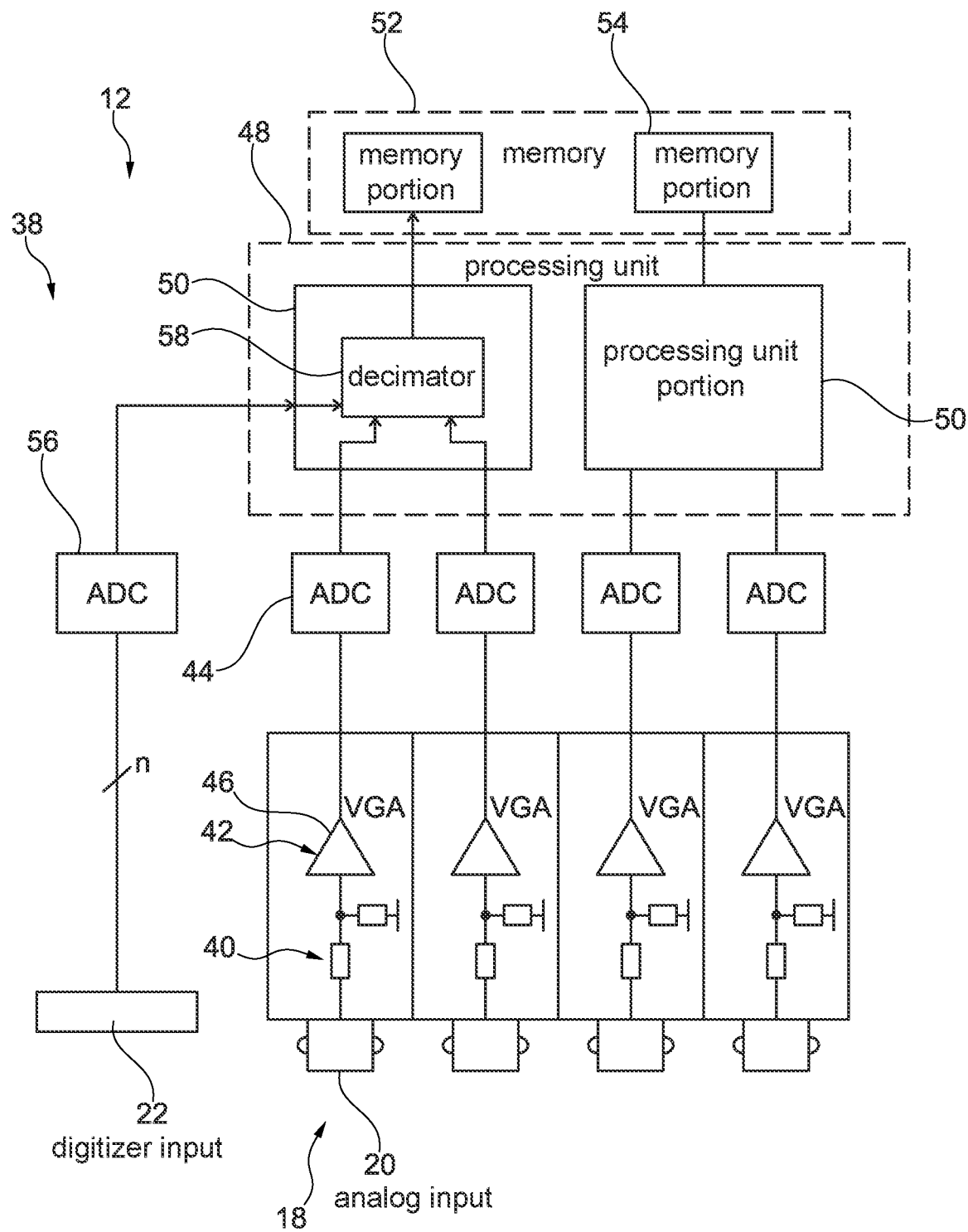
FIG. 2 schematically shows internal components of an electrical test and measurement device according to an embodiment of the present disclosure.

In FIG. 2, the test and measurement device 12 is shown in more detail as internal components are illustrated, for example a functional unit 38. In the shown embodiment, each analog channel 18 of the electrical test and measurement device 12 comprises an attenuator circuit 40, an amplifier unit 42 and a digitizer 44 besides the analog input 20. As shown, the amplifier unit 42 comprises a variable gain amplifier 46 that is used for signals having a high dynamic and high input bandwidth.

The analog channels 18 are each allocated to a signal processing unit 48 that comprises different processing portions 50. In the shown embodiment, two different processing portions 50 are provided wherein each processing portion 50 is allocated to two different analog channels 18.

The signal processing unit 48 is further connected to a memory 52, for example a random access memory, that may also comprise different memory portions 54 as shown in FIG. 2.

Despite the analog channels 18 having their own digitizers 44, another digitizer 56 is provided that is allocated to the digitizer input 22 configured to receive analog signals. Thus, the signals received via the digitizer input 22 are digitized by the digitizer 56 that is also connected to the signal processing unit 48, for example a signal processing unit portion 50.

In the input channel allocated to the digitizer input 22, the analog signals received are directly forwarded to the digitizer 56. Thus, no amplifying and/or attenuation of the signals input via the digitizer input 22 take place within the test and measurement device 12.

The signal processing unit 48, for example the signal processing unit portion 50 connected to the digitizer input 22, comprises a decimator 58 that is used to adapt the sample rate such that the predetermined maximum separate processing power of the signal processing unit 48 is not exceeded.

For instance, the predetermined maximum sample rate processing power is 20 GS/s wherein the decimator 58 decimates the sample rate of the several analog channels 18 as well as the digitizer input 22 such that 8×2.5 GS/s are provided for the four internal analog channels 18 as well as the four external analog channels 28 established by the measurement extension device 16.

Hence, the overall maximum sample rate processing power being available is split in a homogenous manner for all active analog channels 18, 28.

In an alternative embodiment, the decimator 58 is allocated to a certain processing portion 50 without affecting the other processing portion(s) 50 such that only the maximum sample rate processing power of the processing portion 50 is decimated appropriately.

Figure 3:
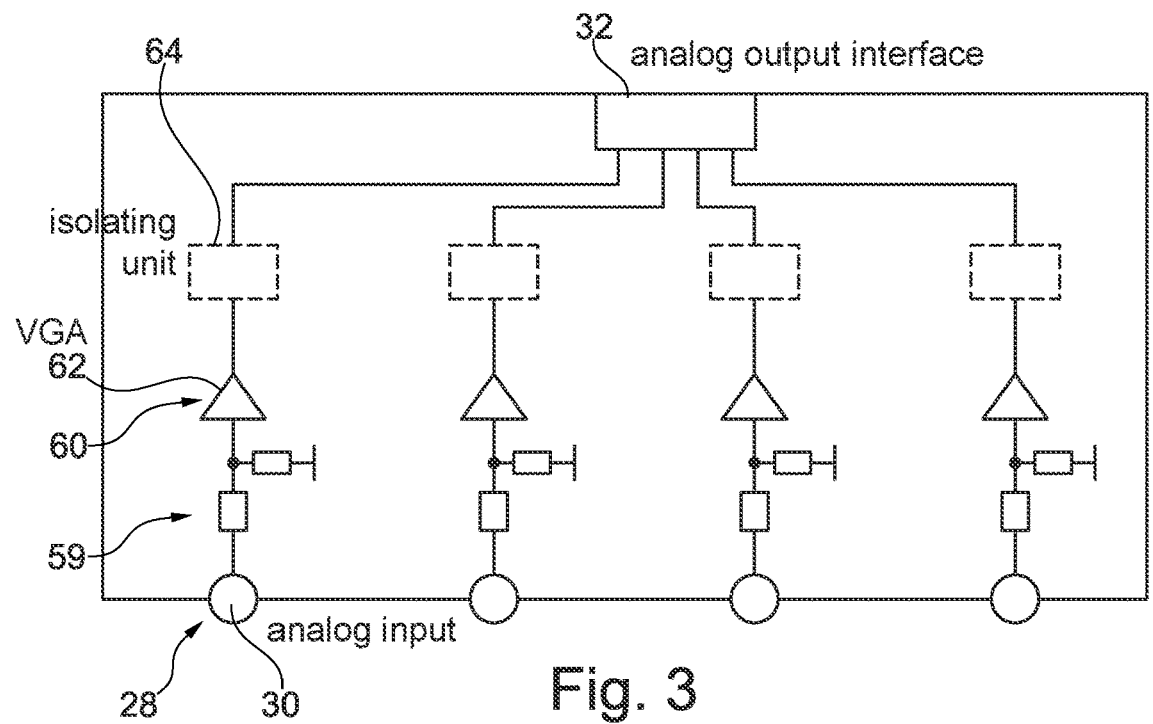
FIG. 3 schematically shows internal components of a measurement extension device according to an embodiment of the present disclosure.

In FIG. 3, the measurement extension device 16 is shown in more detail, for example its internal components.

Each analog channel 28 of the measurement extension device 16 comprises an attenuator circuit 59 that is connected to the corresponding analog input 30 and an amplifier unit 60 that comprises a variable gain amplifier 62.

Figure 4:
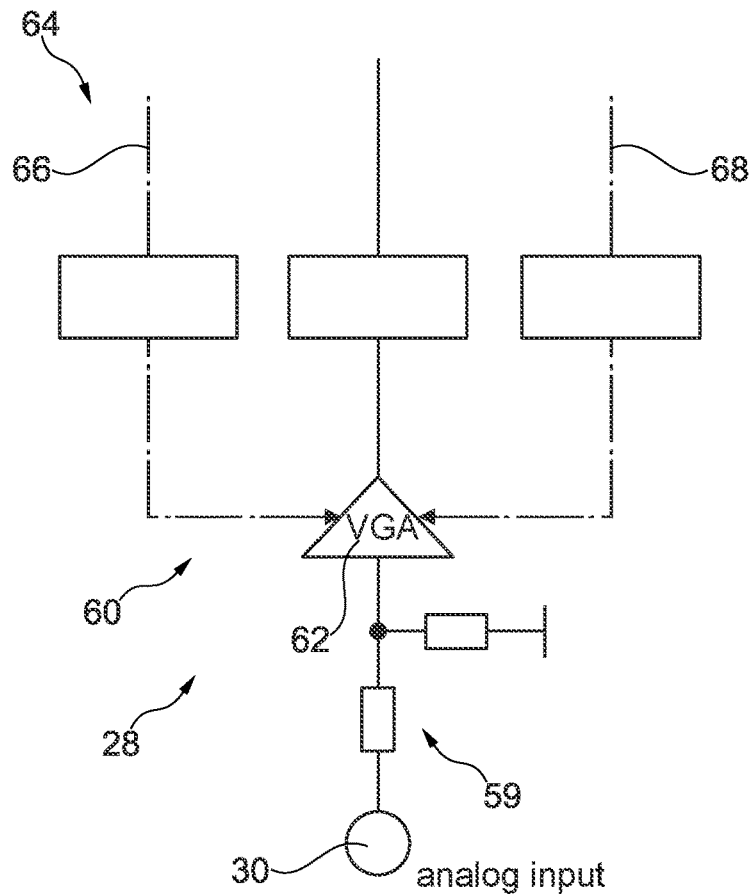
FIG. 4 shows a single analog channel of the measurement extension device of FIG. 3 in more detail.

The amplifier unit 60 is connected with an isolating unit 64 that is shown in FIG. 4 in more detail.

Generally, the different analog channels 28 are each connected with the common analog output interface 32 as shown in FIG. 3.

In FIG. 4, a single analog channel 28 is shown in more detail wherein the isolation unit 64 is also illustrated in more detail.

The isolation unit 64 comprises an isolated control signal interface 66 that is configured to control the amplifier unit 60. The isolator control signal interface 66 may be provided by an optical isolation such that a galvanic isolation is established.

Further, the isolation unit 64 comprises a power supply interface 68 that is also isolated with respect to the other signal lines as shown in FIG. 4. The power supply interface 68 is used to power the amplifier unit 60 appropriately.

Accordingly, the measurement extension device 16 is controlled by the test and measurement device 12, for example via the isolated control signal interface 66 wherein the amplifier unit 60 of the measurement extension device 16 is also powered by the test and measurement device 12 when the measurement extension device 16 is connected to the digitizer input 22.

Figure 5:
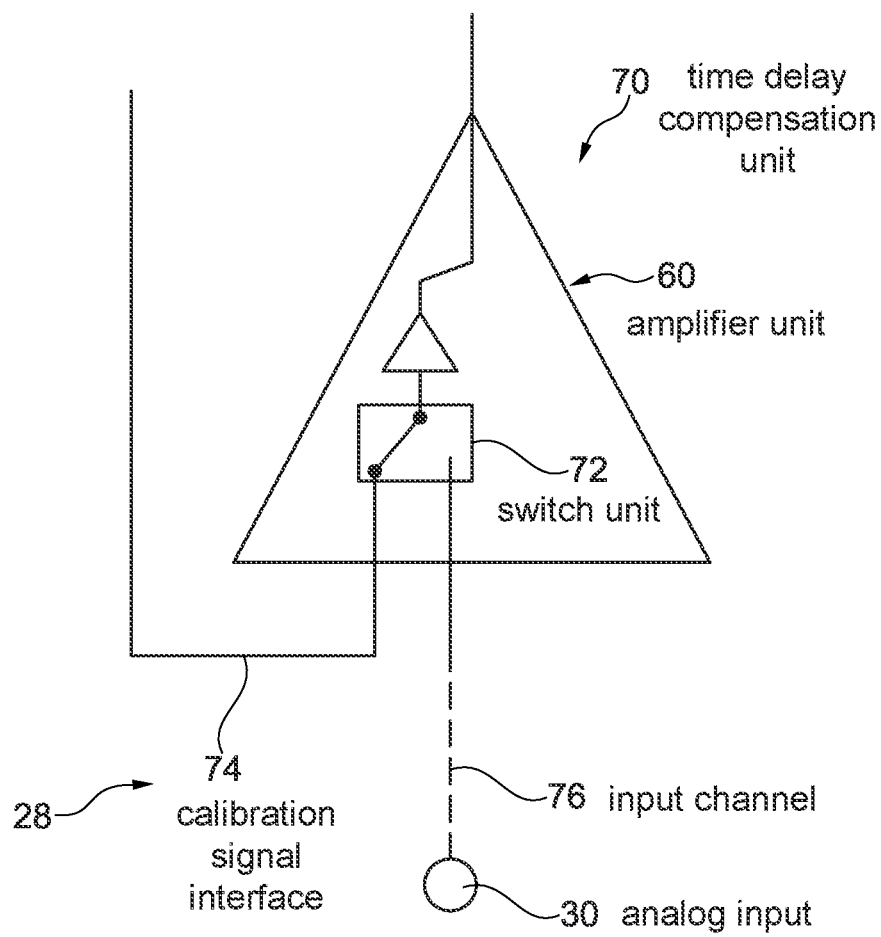
FIG. 5 shows a detail of FIG. 4.

In FIG. 5, another detail of a single analog channel 28 is shown. Each analog channel may comprise a time delay compensation unit 70 that is configured to compensate time delays introduced by the analog channel 28, for example its components such as the amplifier unit 60.

As shown in FIG. 5, the time delay compensation unit 70 comprises a switch unit 72 that is connected to a calibration signal interface 74 as well as an input channel 76 that is provided between the analog input 30 and the amplifier unit 60. In some embodiments, the time delay compensation unit 70 may be established as a part of the amplifier unit 60.

Hence, it is ensured that the time delay compensation unit 70 is allocated to the analog input 30 which is fed by a signal to be processed appropriately.

Figure 6:
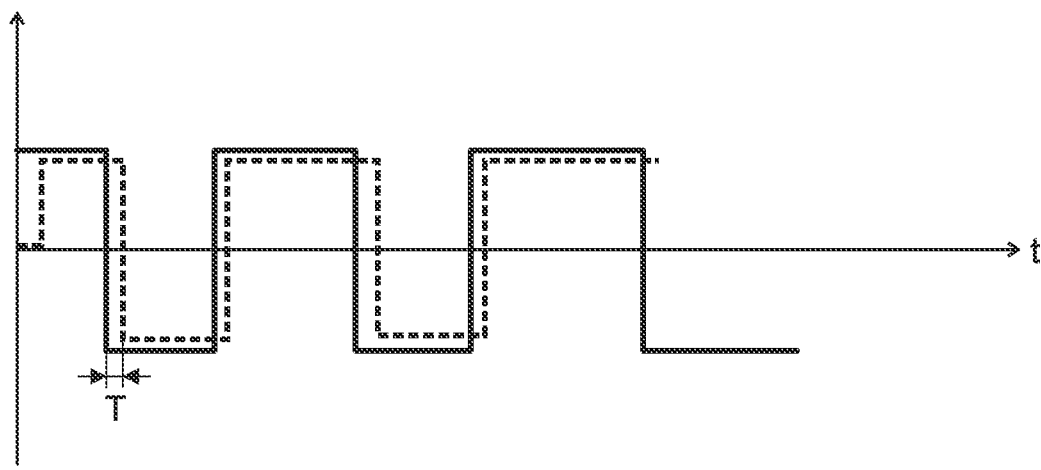
FIG. 6 shows a time chart of two different signals for determining a time delay of the measurement extension device.

As shown in FIG. 6, the time delay compensation unit 70 may generate a calibration signal wherein a calibration signal sent to the amplifier unit 60, for example the variable gain amplifier 62, is compared with a signal received from the amplifier unit 60 in order to determine the occurring time delay T. Thus, the time delay T of the amplifier unit 60, for example the variable gain amplifier 62, can be determined appropriately and thus compensated.

The several analog inputs 30 of the measurement extension device 16 may be established by BNC inputs In general, a possibility is provided that enables measurements requiring a high number of analog inputs. The measurement extension device 16 is connected to the test and measurement device 12 in order to increase the number of analog channels of the test and measurement system 10. This means that the separately formed measurement extension device 16 can be used to extend or increase the capacity of the test and measurement device 12 for performing analog measurements in an appropriate manner. Accordingly, the user does not have to purchase a test and measurement device 12 having a high number of analog channels that are used rarely.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An electrical test and measurement device, the electrical test and measurement device comprising:
   at least one analog channel including an analog input, an attenuator circuit, an amplifier unit, and a first digitizer;
   a second digitizer allocated to a digitizer input of the electrical test and measurement device, the digitizer input being configured to be connected to a measurement extension device so that the number of analog channels of the electrical test and measurement device is increased by the measurement extension device to be connected to the electrical test and measurement device;
   wherein the digitizer input is configured to process signals each having several analog signals inputted to the separately formed measurement extension device;
   wherein analog signals received via the digitizer input are directly forwarded to the second digitizer via an input channel such that no amplifying and/or attenuation of the analog signals received via the digitizer input takes place within the electrical test and measurement device.

2. The electrical test and measurement device according to claim 1, wherein at least two analog channels are provided.

3. The electrical test and measurement device according to claim 1, wherein four analog channels are provided.

4. The electrical test and measurement device according to claim 1, wherein a signal processing unit is provided.

5. The electrical test and measurement device according to claim 4, wherein the signal processing unit has a predetermined maximum sample rate processing power.

6. The electrical test and measurement device according to claim 4, wherein the signal processing unit comprises at least one decimator configured to decimate the sample rate.

7. The electrical test and measurement device according to claim 1, wherein the electrical test and measurement device is an oscilloscope.

8. The electrical test and measurement device according to claim 1, wherein the test and measurement device and the measurement extension device are separately formed.

9. A measurement extension device for being connected to an electrical test and measurement device, the measurement extension device comprising:
   at least two analog channels each comprising an analog input, an attenuator circuit and an amplifier unit;
   wherein the measurement extension device is capable of being connected to an electrical test and measurement device; and
   a common analog output interface with which the analog channels are each connected so that the measurement extension device is configured to increase the number of analog channels of the electrical test and measurement device.

10. The measurement extension device according to claim 9, wherein the analog channel further comprises an isolating unit configured to isolate the analog output interface from at least one of the attenuator circuit and the amplifier unit.

11. The measurement extension device according to claim 10, wherein the isolating unit comprises an isolated control signal interface configured to control the amplifier unit.

12. The measurement extension device according to claim 10, wherein the isolating unit comprises a power supply interface.

13. The measurement extension device according to claim 9, wherein a time delay compensation unit is provided that is configured to compensate time delays introduced by the analog channel.

14. The measurement extension device according to claim 13, wherein the time delay compensation unit comprises a switch unit allocated to the analog input, the switch unit being configured to switch between a calibration signal interface and an input channel allocated to the analog input.

15. The measurement extension device according to claim 9, wherein the analog output interface is configured to be connected with a test and measurement device.

16. The measurement extension device according to claim 9, wherein the amplifier unit comprises a variable gain amplifier.

17. The measurement extension device according to claim 9, wherein at least two analog channels are provided.

18. The measurement extension device according to claim 9, wherein four analog channels are provided.

19. A test and measurement system, the test and measurement system comprising:
   a test and measurement device; and
   a measurement extension device comprising:
      at least two analog channels each comprising an analog input, an attenuator circuit and an amplifier unit; and
      a common analog output interface with which the analog channels are each connected so that the measurement extension device is configured to increase the number of analog channels of the electrical test and measurement device;
   the test and measurement device comprising:
      at least one analog channel comprising an analog input, an attenuator circuit, an amplifier unit, and a digitizer, and
      a second digitizer allocated to a digitizer input of the test and measurement device, the digitizer input being connected to the measurement extension device so that the number of analog channels of the electrical test and measurement device is increased by the measurement extension device to be connected to the electrical test and measurement device;
      wherein the digitizer input is configured to process signals each having several analog signals inputted to the separately formed measurement extension device;
   wherein the test and measurement device and the measurement extension device are separately formed.

20. The test and measurement system according to claim 19, wherein the test and measurement device is extended by the measurement extension device that is connected to the digitizer input, and wherein the digitizer input is configured to process signals each having several analog signals inputted to the separately formed measurement extension device such that the number of analog channels of the test and measurement device is increased by the measurement extension device connected to the electrical test and measurement device.

* * * * *